US011637230B2

(12) United States Patent
Uchida et al.

(10) Patent No.: US 11,637,230 B2
(45) Date of Patent: Apr. 25, 2023

(54) THERMOELECTRIC CONVERSION ELEMENT AND THERMOELECTRIC CONVERSION MODULE HAVING SAME

(71) Applicants: Nihon Parkerizing Co., Ltd., Tokyo (JP); Tokyo University of Science Foundation, Tokyo (JP)

(72) Inventors: Junichi Uchida, Tokyo (JP); Yuki Haijima, Tokyo (JP); Yuki Sueuchi, Tokyo (JP); Tsutomu Iida, Tokyo (JP)

(73) Assignees: Nihon Parkerizing Co., Ltd., Tokyo (JP); Tokyo University of Science Foundation, Tokyo (JP)

( * ) Notice: Subject to any disclaimer, the term of this patent is extended or adjusted under 35 U.S.C. 154(b) by 18 days.

(21) Appl. No.: 17/254,434

(22) PCT Filed: Jun. 28, 2019

(86) PCT No.: PCT/JP2019/025789
§ 371 (c)(1),
(2) Date: Dec. 21, 2020

(87) PCT Pub. No.: WO2020/004617
PCT Pub. Date: Jan. 2, 2020

(65) Prior Publication Data
US 2021/0126178 A1 Apr. 29, 2021

(30) Foreign Application Priority Data
Jun. 28, 2018 (JP) .............................. JP2018-123273

(51) Int. Cl.
*H10N 10/855* (2023.01)
*C01B 33/06* (2006.01)
*H10N 10/01* (2023.01)
*H01L 35/22* (2006.01)
*H01L 35/34* (2006.01)

(52) U.S. Cl.
CPC .............. *H01L 35/22* (2013.01); *C01B 33/06* (2013.01); *H01L 35/34* (2013.01)

(58) Field of Classification Search
CPC ......... H01L 35/22; H01L 35/34; H01L 35/08; H01L 35/18; C01B 33/06
See application file for complete search history.

(56) References Cited

U.S. PATENT DOCUMENTS

| | | | |
|---|---|---|---|
| 3,833,387 A * | 9/1974 | Reed | H01L 35/16 501/75 |
| 2015/0311419 A1* | 10/2015 | Iida | H01L 35/22 136/201 |

FOREIGN PATENT DOCUMENTS

| | | | | |
|---|---|---|---|---|
| CN | 107227475 A | * | 10/2017 | |
| EP | 685893 A1 | * | 12/1995 | ............. H01L 35/32 |
| JP | H0463481 A | | 2/1992 | |
| JP | 2003-145034 A | | 5/2003 | |
| JP | 2005-298765 A | | 10/2005 | |
| JP | 2013-500608 A | | 1/2013 | |
| JP | 2017-50325 A | | 3/2017 | |
| KR | 2017061229 A | * | 6/2017 | ............. H01L 35/34 |
| WO | WO-2011-148686 A1 | | 12/2011 | |

OTHER PUBLICATIONS

KR-2017061229-A English machine translation (Year: 2017).*
Park et al, Microscopic observation of degradation behavior in yttria and ceria stabilized zirconia thermal barrier coatings under hot corrosion, 2005, Surface & Coatings Technology 190, 357-365. (Year: 2005).*
CN-107227475-A English machine translation (Year: 2017).*
Search Report and Written Opinion in International Application No. PCT/JP2019/025789 dated Sep. 3, 2019, 1 page.

* cited by examiner

*Primary Examiner* — Andrew J Golden
(74) *Attorney, Agent, or Firm* — Marshall, Gerstein & Borun LLP

(57) ABSTRACT

The purpose of the present invention is to provide a thermoelectric conversion element having a film which not only maintains sufficient adhesion even when exposed to a high temperature but also exhibits excellent oxidation resistance and crack resistance. The problem is solved by a thermoelectric conversion element including a thermoelectric conversion component, in which the thermoelectric conversion component contains magnesium silicide and/or manganese silicide and is covered with a film containing Si and Zr.

4 Claims, No Drawings

THERMOELECTRIC CONVERSION ELEMENT AND THERMOELECTRIC CONVERSION MODULE HAVING SAME

TECHNICAL FIELD

The present invention relates to a thermoelectric conversion element, and a thermoelectric conversion module including the same. More particularly, the present invention relates to a thermoelectric conversion element which can be used as a thermoelectric conversion means of a thermoelectric generator or the like, and a thermoelectric conversion module including the thermoelectric conversion element.

BACKGROUND ART

As thermoelectric materials, for example, thermoelectric generation elements and Peltier elements, which are capable of converting thermal energy into electrical energy and vice versa, are conventionally known. Thermoelectric generation to which a thermoelectric material is applied is advantageous in that, for example, it can directly convert thermal energy into electric power and does not require any moving parts, therefore, such thermoelectric generation is employed in wrist watches driven by body heat, space power supplies, and the like. Particularly, thermoelectric generation employed in automobiles, home electrical appliances, incinerators, office-automation equipment, and power plants converts waste heat into electrical energy and is thus attractive.

The thermoelectric conversion performance varies depending on the Seebeck coefficient, the electrical conductivity and the thermal conductivity of a thermoelectric conversion material and is improved as the Seebeck coefficient and the electrical conductivity are increased or the thermal conductivity is reduced. Accordingly, for the purpose of improving the thermoelectric conversion performance of a device itself, thermoelectric materials in which a variety of elements are combined have been developed. Further, thermoelectric materials are used in various fields under conditions where waste heat is generated, such as automobiles, home electrical appliances, and office-automation equipment. Their use environment includes various environments, such an outdoor environment, an environment exposed to sea breeze, rain and the like, and an environment exposed to plant emissions, therefore, thermoelectric materials are required to be usable without being deteriorated even in harsh environments. Particularly, in power generation by a thermoelectric conversion module, it is desirable to directly utilize waste heat generated from an incinerator or an industrial furnace. However, the heat resistance of the thermoelectric conversion module presents a problem and, at present, it is difficult to generate electricity when the waste heat has a temperature of about 600° C.

In the production of a thermoelectric element from a material, a sintered body of the material that has a formulation corresponding to a P-type or N-type thermoelectric element is cut perpendicular to the crystal growth direction and divided into a block shape using a wire or a dicing blade to produce a thermoelectric conversion element. The thus obtained thermoelectric conversion element is further polished to flatten the surface. Subsequently, the polishing dust is removed by a cleaning process or the like, however, the removability of adhered polishing dust is low, making it difficult to achieve a high level of cleanliness required for electronic materials. In addition, the cleaning process is accompanied by precipitation of an ionic component contained in a cleaning agent and oxidation of the thermoelectric conversion element, and it is thus difficult to attain a satisfactory flatness of the surface of the thermoelectric conversion element.

Recently, technologies for forming a film have been developed for the protection of electronic components and microdevice parts of automobiles, home electrical appliances and office-automation equipment.

For example, technologies for forming an organic film, particularly a surface treatment film mainly composed of an organic component, on the surface of an electronic component or a microdevice part, as well as technologies for forming a protective film using a sealing material have been developed. More specifically, Patent Document 1 discloses a technology relating to a self-deposition type surface treatment coating method in which the surface of an electronic component or a microdevice part is brought into contact with a self-deposition type surface treatment liquid containing a prescribed organic polymer resin to deposit and form an organic film, and the thus formed organic film is subsequently brought into contact with a post-treatment liquid containing a prescribed curing agent, followed by solvent removal, whereby a paint film is formed. Patent Document 2 discloses a technology for curing an acrylic sealing material composed of two compositions containing methyl methacrylate, an inorganic filler and the like. Further, as a method of improving the heat resistance of a thermoelectric conversion element, Patent Document 3 discloses a method of making a thermoelectric conversion module usable in high-temperature environments by using a sintered material containing magnesium silicide as a main component.

RELATED ART DOCUMENTS

Patent Documents

[Patent Document 1] Japanese Unexamined Patent Application Publication No. 2003-145034
[Patent Document 2] Japanese Unexamined Patent Application Publication No. 2005-298765
[Patent Document 3] WO2011/148686

SUMMARY OF THE INVENTION

Problems to be Solved by the Invention

The present inventors heated a sample, which was prepared by doping 0.5% by atom of antimony to a sintered body of polycrystalline magnesium silicide that is a representative material of a thermoelectric conversion component, to a temperature of about 600° C. in the air atmosphere and observed the sample after 10 hours, 100 hours, and 1,000 hours. As a result, it was confirmed that the oxygen concentration on the sintered body surface was increased, and progress of oxidation was observed with generation of black grains, which originated from grain boundaries formed during sintering, over the entire surface. Thus, the present inventors recognized the need for protecting the surface of a thermoelectric conversion component. As described above, thermoelectric materials are often used in harsher environments, therefore, the levels of properties required for films covering the surfaces of such thermoelectric materials have been further raised.

Particularly, since thermoelectric materials are used in a heat cycle in which a high-temperature environment (about 600° C. or higher) and a low-temperature environment are created repeatedly, there is a demand for the development of a thermoelectric conversion element having a film with excellent oxidation resistance, crack resistance and adhesion, which film is capable of suppressing not only oxidation, sublimation and contamination of a thermoelectric material but also a reduction in the thermoelectric conversion efficiency and the durability of the thermoelectric material even when the thermoelectric conversion element is used under a high temperature.

In the technologies for forming an organic film that are disclosed in Patent Documents 1 and 2, decomposition of an organic substance constituting the organic film occurs under a high-temperature environment, and desired properties are thus not exerted.

Further, in Patent Document 3, the environment to which the thermoelectric material is exposed shifts to a high-temperature condition during the use and to a low-temperature (room temperature: about 10 to 40° C.) condition during nonuse, therefore, the thermoelectric material is in a state of repeatedly undergoing thermal expansion and contraction and, when exposed to such a heat cycle, deterioration of the thermoelectric conversion element itself (reduction in thermoelectric conversion efficiency and peeling) is observed.

In view of the above-described circumstances, an object of the present invention is to provide a thermoelectric conversion element having a film which not only maintains sufficient adhesion even when exposed to a high temperature but also exhibits excellent oxidation resistance and crack resistance.

Means for Solving the Problems

The present inventors intensively studied to achieve the above-described object and consequently discovered that the above-described problems can be solved by covering a thermoelectric conversion component, which contains magnesium silicide and/or manganese silicide, with a film containing Si and Zr, thereby completing the present invention.

In other words, the present inventors discovered that the above-described object can be achieved by the following constitutions.

(1) A thermoelectric conversion element, including a thermoelectric conversion component,
wherein the thermoelectric conversion component contains magnesium silicide and/or manganese silicide and is covered with a film containing Si and Zr.

(2) The thermoelectric conversion element according to (1), wherein a ratio (ZM/SM) of a Zr mass (ZM) to a Si mass (SM) in the film is in a range of 0.09 to 1.26.

(3) The thermoelectric conversion element according to (1) or (2), wherein the film of the thermoelectric conversion component is formed by formed by contacting a surface treatment agent containing Si and Zr ions with the thermoelectric conversion component.

(4) The thermoelectric conversion element according to (3), wherein the surface treatment agent is obtained by mixing
an alkali metal silicate (A),
cerium oxide-stabilized zirconium oxide (B), and
a component (C) that contains at least one selected from metal oxide particles and clay minerals except for the alkali metal silicate (A) and cerium oxide-stabilized zirconium oxide (B).

(5) The thermoelectric conversion element according to any one of (1) to (4), wherein the thermoelectric conversion component contains polycrystalline magnesium silicide and/or polycrystalline manganese silicide.

(6) The thermoelectric conversion element according to any one of (3) to (5), wherein the film is formed from the surface treatment agent after contact of the thermoelectric conversion component with a pretreatment agent that contains a phosphoric acid compound and water.

(7) A thermoelectric conversion module, including the thermoelectric conversion element according to any one of (1) to (6).

Advantageous Effects of the Invention

According to the present invention, a thermoelectric conversion element having a film which not only maintains sufficient adhesion even when exposed to a high temperature but also exhibits excellent oxidation resistance and crack resistance can be provided.

DESCRIPTION OF EMBODIMENTS

One aspect of the present invention is a thermoelectric conversion element including a thermoelectric conversion component, in which the thermoelectric conversion component contains magnesium silicide and/or manganese silicide and is covered with a film containing Si and Zr.

The thermoelectric conversion element of the present invention will now be described.

<Thermoelectric Conversion Component>

The thermoelectric conversion component contains magnesium silicide ($Mg_2Si$) and/or manganese silicide (e.g., MnSi or $Mn_4Si_7$). The magnesium silicide and/or manganese silicide may contain other metal as required. The other metal may be contained as a dopant or in the form of substituting Mg, Mn and/or Si, and examples of the other metal include Ge, Sn, Zn, Sb, Al, and Ta. The content of the other metal is not particularly restricted, and it may be not less than 0.01% by atom, not less than 0.05% by atom, or not less than 0.1% by atom, but 10% by atom or less, or 5% by atom or less. The magnesium silicide and manganese silicide may be of a doped type that contains the above-described other metal as a dopant, or an undoped type that does not contain the above-described other metal.

As the magnesium silicide and/or manganese silicide, polycrystalline magnesium silicide and/or polycrystalline manganese silicide are preferred because of their high thermoelectric conversion efficiency.

The shape of the thermoelectric conversion component is not particularly restricted, and the thermoelectric conversion component may have a columnar shape or a flat-plate shape. The term "columnar" used herein encompasses prismatic shapes, such as triangular prism, quadrangular prism and hexagonal prism, as well as cylindrical shapes and elliptic cylindrical shapes.

A method of producing the thermoelectric conversion component is not particularly restricted. For example, when polycrystalline magnesium silicide is used, an ingot A is obtained by mixing magnesium and silicon at a stoichiometric ratio along with about 0.01 to 10.0% by atom of one or more dopant elements as required, allowing the resulting mixture to react with heating at such a temperature that melts all of the raw materials (e.g., at 1,370 K to 1,400 K), and then cooling the resultant. Subsequently, particles formed by pulverizing the thus obtained ingot A are subjected to spark plasma sintering to obtain an ingot B. The thus obtained ingot B is cut out into a columnar body of a prescribed size using a wire saw or the like, and this columnar body can be used as the thermoelectric conversion component of the thermoelectric conversion element. Alternatively, when the ingot A is homogeneous with only a small amount of voids and the like, the thermoelectric conversion component can be obtained by directly cutting out a columnar body from the ingot A.

<Film Containing Si and Zr>

The film covering the thermoelectric conversion component contains Si and Zr. The film may also contain a metal element(s) other than Si and Zr, and such other metal elements are described below in the section of surface treatment agent.

A method of covering the thermoelectric conversion component with the film is not particularly restricted and, for example, a method of forming the film on the thermoelectric conversion component by contacting the thermoelectric conversion component with the below-described surface treatment agent and subsequently drying (preferably heat-drying) the surface treatment agent as required is preferably employed. The mass of the film to be formed on the thermoelectric conversion component is not particularly restricted, however, it is preferably 0.5 to 20 g/m$^2$, more preferably 2 to 10 g/m$^2$.

A method of contacting the thermoelectric conversion component with the surface treatment agent is not particularly restricted, and it is preferred to uniformly coat the thermoelectric conversion component with the surface treatment agent by, for example, a roll coating method, an immersion method, or a spray coating method.

The heating temperature for drying the film covering the thermoelectric conversion component is not particularly restricted, however, it is preferably not higher than 280° C., more preferably not higher than 250° C. A heating temperature of 280° C. or lower does not require a special equipment and is thus extremely widely adaptable from the industrial standpoint.

A heat-drying method is also not particularly restricted, and the surface treatment agent may be dried by heating in the atmospheric environment using a hot-air or induction heater, or with infrared ray, near-infrared ray or the like. As for the heating time, optimum conditions are selected as appropriate in accordance with the species and the like of compounds contained in the surface treatment agent to be used.

The ratio (ZM/SM) of the Zr mass (ZM) to the Si mass (SM) in the film covering the thermoelectric conversion component is not particularly restricted, however, the ratio (ZM/SM) is preferably in a range of 0.09 to 1.26, more preferably 0.25 to 0.72, still more preferably 0.32 to 0.59.

<Surface Treatment Agent>

The surface treatment agent used in the present embodiment may be any surface treatment agent that is capable of forming a film containing Si and Zr on a thermoelectric conversion component, and the surface treatment agent more preferably is obtained by mixing an alkali metal silicate (A), cerium oxide-stabilized zirconium oxide (B), and a component (C) that contains at least one selected from metal oxide particles and clay minerals.

The components that may be contained in the surface treatment agent will now be described.

<Alkali Metal Silicate (A)>

The surface treatment agent preferably contains an alkali metal silicate (A). The alkali metal silicate (A) is a compound and/or mixture that contains an alkali metal oxide (M$_2$O) and silica (SiO$_2$), and is represented by M$_2$O. SiO$_2$. The molar ratio of silica with respect to the alkali metal oxide (SiO$_2$/M$_2$O) is preferably in a range of 1.8 to 7.0. A method of producing the alkali metal silicate (A) is not particularly restricted, and any known method can be employed. For example, the alkali metal oxide and silica may be mixed to obtain a mixture, or a commercially available compound containing the alkali metal oxide and silica may be used. Examples of the alkali metal component M include metal components such as sodium, potassium, and lithium. As the alkali metal silicate (A), a widely commercially available alkali metal silicate in a liquid form can be used, and specific examples thereof include water glass Nos. 1, 2 and 3, calcium silicate solutions, and lithium silicate solutions. These alkali metal silicates (A) may be used singly, or in combination of two or more thereof.

The content of the alkali metal silicate (A) in the surface treatment agent is not particularly restricted, however, it is preferably in a range of 42.8% by mass to 87.5% by mass, more preferably in a range of 53.8% by mass to 78.5% by mass, still more preferably in a range of 59.1% by mass to 73.9% by mass, with respect to a total solid content in the surface treatment agent.

It is noted here that the term "total solid content" used herein means a total amount of solids of the alkali metal silicate (A), the below-described cerium oxide-stabilized zirconium oxide (B) and the component (C), not including any volatile component such as a solvent.

<Cerium Oxide-Stabilized Zirconium Oxide (B)>

The surface treatment agent preferably contains cerium oxide-stabilized zirconium oxide (B). The cerium oxide-stabilized zirconium oxide (B) is zirconium oxide stabilized with cerium oxide that is a stabilizer. A method of producing the cerium oxide-stabilized zirconium oxide (B) is not particularly restricted, and examples thereof include a method in which a zirconium salt and a cerium-containing salt are dissolved in water and wet-mixed, the resulting solution is added to aqueous ammonia to obtain precipitates, and the thus obtained precipitates are subsequently filtered, washed with water and then fired to obtain cerium oxide-stabilized zirconium.

Examples of the zirconium salt include zirconium nitrate and zirconium hydroxide. A cerium source may be, for example, cerium nitrate or cerium hydroxide.

The firing temperature of the cerium oxide-stabilized zirconium oxide (B) is not particularly restricted, however, it is preferably about 800 to 1,450° C. By performing the firing in this temperature rage, fine cerium oxide-stabilized zirconium oxide can be obtained.

The cerium oxide-stabilized zirconium oxide (B) obtained after the firing may be pulverized to adjust the average particle size. The average particle size is preferably in a range of 0.05 μm to 20 μm, more preferably in a range of 0.1 μm to 10 μm, particularly preferably in a range of 0.2 μm to 5 μm. As for a method of measuring the average particle size, for example, the measurement can be performed by a known particle size distribution analysis method such as a laser diffraction-scattering method.

The content of the cerium oxide-stabilized zirconium oxide (B) in the surface treatment agent is not particularly restricted, however, the ratio (BM/AM) of the mass (BM) of the stabilized zirconium oxide (B) to the mass (AM) of the alkali metal silicate (A) is preferably in a range of 0.08 to 0.5, more preferably in a range of 0.16 to 0.37, still more preferably in a range of 0.17 to 0.31.

<Component (C)>

The surface treatment agent preferably contains a component (C) that contains at least one selected from metal oxide particles and clay minerals. It is noted here that the component (C) does not contain any substance corresponding to the above-described alkali metal silicate (A) or cerium oxide-stabilized zirconium oxide (B).

A component constituting the metal oxide particles in the component (C) is not particularly restricted, and examples thereof include aluminum oxide, silicon oxide, silicates, phosphates, oxoacid salts, iron oxide, magnesium oxide, zinc oxide, titanium oxide, and complexes of these materials.

Examples of the clay minerals in the component (C) include layered clay minerals having a layered structure in which a large number of sheets are formed in a laminated manner. The layered clay minerals are, for example, layered silicate minerals. The layer-forming sheets may be tetrahedral sheets composed of silicic acid and oxygen, or octahedral sheets containing aluminum and/or magnesium.

Specific examples of the clay minerals (layered clay minerals) include smectites, such as montmorillonite, bentonite, beidellite, hectorite, and saponite; vermiculites; micas, such as illite, muscovite, phlogopite, and biotite; brittle micas, such as margarite and clintonite; chlorites such as sudoite; kaolins, such as kaolinite and halloysite; and serpentines such as antigorite. These clay minerals may be naturally-occurring or synthetic clay minerals, and any one of these clay minerals may be used singly, or two or more thereof may be used in combination.

As the component (C), it is also possible to use an intercalation compound (e.g., pillared crystal) in which a guest compound is incorporated between layers of a layered clay mineral (host), a layered clay mineral in which ions contained between layers are exchanged with other ions, or a layered clay mineral that has been subjected to a surface treatment (e.g., a surface treatment with a silane coupling agent, or a complex treatment by a combination of a surface treatment with a silane coupling agent and a surface treatment with an organic binder).

As the component (C), any one of the above-described compounds may be used singly, or two or more thereof may be used in combination.

The average particle size of the component (C) is not particularly restricted, however, it is preferably in a range of 0.05 μm to 20 μm, more preferably in a range of 0.1 μm to 10 μm, particularly preferably in a range of 0.2 μm to 5 μm.

As for a method of measuring the average particle size, for example, the measurement can be performed by a known particle size distribution analysis method such as a laser diffraction-scattering method.

The content of the component (C) in the surface treatment agent is not particularly restricted, however, the ratio (CM/AM) of the mass (CM) of the component (C) to the mass (AM) of the alkali metal silicate (A) is preferably in a range of 0.08 to 0.5, more preferably in a range of 0.16 to 0.37, still more preferably in a range of 0.17 to 0.31.

The surface treatment agent may contain a solvent to dissolve or disperse the components [components (A) to (C)] for the formation of the film, and/or to adjust the concentration of the components.

The solvent is not particularly restricted as long as it is water or a mixture of water and a water-miscible organic solvent (a mixture containing not less than 50% by volume of water based on the volume of aqueous medium). The water-miscible organic solvent is not particularly restricted as long as it is miscible with water, and examples thereof include ketone-based solvents, such as acetone and methyl ethyl ketone; amide-based solvents, such as N,N'-dimethylformamide and dimethylacetamide; alcohol-based solvents, such as methanol, ethanol, and isopropanol; ether-based solvents, such as ethylene glycol monobutyl ether and ethylene glycol monohexyl ether; and pyrrolidone-based solvents, such as 1-methyl-2-pyrrolidone and 1-ethyl-2-pyrrolidone. These water-miscible organic solvents may be mixed with water singly, or in combination of two or more thereof.

The content of the solvent is preferably 30 to 90% by mass, more preferably 40 to 80% by mass, with respect to a total amount of the treatment agent.

When water (e.g., deionized water) is used as the solvent, the pH of the surface treatment agent is preferably 6 to 11, more preferably 8 to 10, with a pH of 9 being the median value. For pH adjustment, it is preferred to use ammonia, carbonic acid, nitric acid, an organic acid, or the like.

The surface treatment agent may also contain a surfactant.

The species of the surfactant is not particularly restricted, and an anionic surfactant, a nonionic surfactant, or a cationic surfactant can be used.

A method of producing the surface treatment agent is not particularly restricted, and the surface treatment agent can be produced by, for example, adding prescribed amounts of the above-described components [alkali metal silicate (A), cerium oxide-stabilized zirconium oxide (B), and component (C)] to a prescribed solvent, further adding other components such as a pH modifier and a surfactant as required, and then mixing the added materials.

Further, as required, the surface treatment agent to which the surfactant is added may be subjected to a stirring treatment using a stirring apparatus such as a homomixer or a dispersion mixer, or an emulsification apparatus such as a high-pressure homogenizer or a colloid mill, so as to disperse the cerium oxide-stabilized zirconium oxide (B) and the component (C) in the surface treatment agent.

Moreover, as required, the thermoelectric conversion component may be subjected to a pretreatment before contacting with the surface treatment agent. A method of this pretreatment is not particularly restricted, and examples thereof include hot-water washing, solvent washing, alkali degreasing, and acid pickling.

In a more preferred embodiment, for example, the film is formed by contacting the surface treatment agent with the thermoelectric conversion component composed of polycrystalline magnesium silicide and/or polycrystalline manganese silicide after contacting a pretreatment agent containing a phosphoric acid compound and water with the thermoelectric conversion component to perform a pretreatment.

The phosphoric acid compound is not particularly restricted, and examples thereof include orthophosphoric acid, metaphosphoric acid, condensed phosphoric acid, pyrophosphoric acid, tripolyphosphoric acid, tetraphosphoric acid, hexametaphosphoric acid, and salts thereof, as well as magnesium biphosphate, ammonium dihydrogen phosphate, diammonium hydrogen phosphate, triammonium phosphate, hydroxylammonium phosphate, potassium dihydrogen phosphate, dipotassium hydrogen phosphate, potassium phosphate, sodium dihydrogen phosphate, disodium hydrogen phosphate, trisodium phosphate, aluminum phosphate, nickel phosphate, and cobalt phosphate. These phosphoric acid compounds may be used singly, or in combination of two or more thereof.

The concentration of the phosphoric acid compound(s) in the pretreatment agent is not particularly restricted, however, it is preferably 0.1 to 20% by mass, more preferably 0.5 to 10% by mass, still more preferably 2 to 5% by mass.

Further, the pretreatment agent may contain, for example, an aqueous solvent, a surfactant, a chelating agent, an antifoaming agent, and/or a pH modifier.

<Thermoelectric Conversion Element>

The thermoelectric conversion element may take any form as long as it includes a thermoelectric conversion component covered with a film containing Si and Zr, however, the thermoelectric conversion element typically takes a form in which opposing electrode layers are formed on the respective ends of the thermoelectric conversion component. The electrode layers may be composed of a metal silicide, a metallic material or the like, and are preferably composed of a material having a low contact resistance with the thermoelectric conversion component.

A method of forming the electrode layers on the respective ends of the thermoelectric conversion component is not restricted, and the thermoelectric conversion element in which opposing electrode layers are formed on the respective ends of the thermoelectric conversion component can be obtained by, for example, accumulating metal particles constituting the electrode layers on both sides of a pulverized particle aggregate of magnesium silicide and/or manganese silicide placed in a sintering apparatus, subsequently integrally sintering these materials to produce an ingot, and then cutting out this ingot into a columnar shape. Alternatively, both ends of a columnar body of magnesium silicide and/or manganese silicide, which is the thermoelectric conversion component, are immersion-coated with a dispersion of metal particles constituting the electrode layers by a method that does not cause adhesion of a film containing Si and Zr thereto, or a film containing Si and Zr is removed from both ends of a columnar body of magnesium silicide and/or manganese silicide that has been covered with the film and an electroconductive paste is subsequently applied thereto, or a method of vapor-depositing an electroconductive metallic material onto a columnar body of magnesium silicide and/or manganese silicide may be employed.

<Thermoelectric Conversion Module>

The thermoelectric conversion module includes the above-described thermoelectric conversion element and may be formed by connecting the electrode layers formed on the respective ends of the thermoelectric conversion component with electrode layers of other thermoelectric conversion element via connection wiring, however, a method of producing the thermoelectric conversion module is not restricted thereto. In the thermoelectric conversion module, the output can be increased by connecting plural thermoelectric conversion elements.

EXAMPLES

The present invention will now be described more concretely by way of Examples thereof. The below-described Examples do not restrict the present invention by any means, and design modifications made in accordance with changes in the conditions are included in the technical scope of the present invention.

(1) Sample Materials

A sample material e1 was prepared by cutting out a 3 mm×3 mm×6 mm columnar body for thermoelectric conversion component from an ingot of magnesium silicide sintered body (doped with Sb (0.5% by atom) and Zn (0.5% by atom)).

The doped-type magnesium silicide sintered body was obtained as a $Mg_2Si$ sintered ingot doped with Sb and Zn by mixing 61.12 g of Mg, 35.31 g of Si, 2.32 g of Sb and 1.26 g of Zn, heating the resulting mixture at 1,400 K, and subsequently cooling the resultant.

A sample material e2 was prepared by cutting out a 3 mm×3 mm×6 mm columnar body for thermoelectric conversion component from an ingot of manganese silicide sintered body (undoped).

The manganese silicide sintered body was obtained as an undoped-type $Mn_4Si_7$ sintered ingot by mixing 52.78 g of Mn and 47.22 g of Si, heating the resulting mixture at 1,400 K, and subsequently cooling the resultant.

(2) Pretreatment with Pretreatment Agent

The surfaces of the above-described sample materials were pretreated with the following pretreatment agents (d1 to d3) by an immersion method. Then, after washing the sample materials with tap water and confirming that their surfaces were wetted 100%, pure water was further poured over the sample materials, and the sample materials were heated in a 100° C. atmospheric oven to remove water.

d1: HCl 3%-by-mass aqueous solution d2: $Na_4P_2O_7$ 3%-by-mass aqueous solution d3: NaOH 3%-by-mass aqueous solution (3) Preparation of Surface Treatment Agents Surface treatment agents 1 to 32 (solid concentration: 10 to 60% by mass) were obtained by mixing, in water, the following alkali metal silicate (A), the cerium oxide-stabilized zirconium (B) shown in Table 1 and the component (C) shown in Table 2 in the respective amounts (mixing ratios) shown in Table 3 with respect to the total solid content of each surface treatment agent, and subsequently adjusting the resulting mixture to have a pH of 9 with aqueous ammonia and nitric acid.

It is noted here that a main component other than the alkali metal silicate (A), the cerium oxide-stabilized zirconium oxide (B) and the component (C) was water.

a1: potassium silicate obtained by mixing potassium silicate with gas-phase silica so that a molar ratio $SiO_2/K_2O$ is 4.1 a2: methyl phenyl silicone resin (KR-311, manufactured by Shin-Etsu Chemical Co., Ltd.)

TABLE 1

| code | average particle size (μm) | blending amount of cerium oxide (wt %) |
|---|---|---|
| b1 | 0.05 | 16 |
| b2 | 0.1 | 16 |
| b3 | 0.5 | 16 |
| b4 | 0.7 | 16 |
| b5 | 5.0 | 16 |
| b6 | 10 | 16 |
| b7 | 20 | 16 |

TABLE 2

| code | species | average particle size (μm) |
|---|---|---|
| c1 | mica | 0.05 |
| c2 | mica | 0.1 |
| c3 | mica | 0.2 |
| c4 | mica | 4.0 |
| c5 | mica | 5.0 |
| c6 | mica | 10 |
| c7 | mica | 20 |
| c8 | titanium oxide | 4.0 |

TABLE 3

| surface treatment agent No. | $Z_M/S_M$ | alkali metal silicate (A) species | mass % | cerium oxide-stabilized zirconium oxide (B) species | mass % | component (C) species | mass % |
|---|---|---|---|---|---|---|---|
| 1 | 1.26 | a1 | 38.0 | b4 | 31.0 | c4 | 31.0 |
| 2 | 0.72 | a1 | 53.8 | b4 | 23.1 | c4 | 23.1 |
| 3 | 0.59 | a1 | 59.0 | b4 | 20.5 | c4 | 20.5 |
| 4 | 0.44 | a1 | 66.6 | b4 | 16.7 | c4 | 16.7 |
| 5 | 0.32 | a1 | 74 | b4 | 13.0 | c4 | 13.0 |
| 6 | 0.25 | a1 | 78.6 | b4 | 10.7 | c4 | 10.7 |
| 7 | 0.09 | a1 | 91.2 | b4 | 4.4 | c4 | 4.4 |
| 8 | 0.44 | a1 | 66.6 | b1 | 16.7 | c4 | 16.7 |
| 9 | 0.44 | a1 | 66.6 | b2 | 16.7 | c4 | 16.7 |
| 10 | 0.44 | a1 | 66.6 | b3 | 16.7 | c4 | 16.7 |
| 11 | 0.44 | a1 | 66.6 | b5 | 16.7 | c4 | 16.7 |
| 12 | 0.44 | a1 | 66.6 | b6 | 16.7 | c4 | 16.7 |
| 13 | 0.44 | a1 | 66.6 | b7 | 16.7 | c4 | 16.7 |
| 14 | 0.44 | a1 | 66.6 | b4 | 16.7 | c1 | 16.7 |
| 15 | 0.44 | a1 | 66.6 | b4 | 16.7 | c2 | 16.7 |
| 16 | 0.44 | a1 | 66.6 | b4 | 16.7 | c3 | 16.7 |
| 17 | 0.44 | a1 | 66.6 | b4 | 16.7 | c5 | 16.7 |
| 18 | 0.44 | a1 | 66.6 | b4 | 16.7 | c6 | 16.7 |
| 19 | 0.44 | a1 | 66.6 | b4 | 16.7 | c7 | 16.7 |
| 20 | 0.44 | a1 | 66.6 | b4 | 16.7 | c4 | 16.7 |
| 21 | 0.44 | a1 | 66.6 | b4 | 16.7 | c4 | 16.7 |
| 22 | 0.72 | a1 | 53.8 | b4 | 23.1 | c4 | 23.1 |
| 23 | 0.72 | a1 | 53.8 | b4 | 23.1 | c4 | 23.1 |
| 24 | 0.72 | a1 | 53.8 | b4 | 23.1 | c4 | 23.1 |
| 25 | 0.72 | a1 | 53.8 | b4 | 23.1 | c4 | 23.1 |
| 26 | 0.72 | a1 | 53.8 | b4 | 23.1 | c4 | 23.1 |
| 27 | 0.72 | a1 | 53.8 | b4 | 23.1 | c4 | 23.1 |
| 28 | — | a1 | 83.3 | | | c4 | 16.7 |
| 29 | — | a1 | 100 | | | | |
| 30 | — | a2 | 100 | | | | |
| 31 | — | | | b4 | 100.0 | | |
| 32 | — | a1 | 83.3 | | | c8 | 16.7 |

(4) Surface Treatment with Surface Treatment Agent

The surface treatment was performed by contacting the pretreated sample materials with each of the surface treatment agents 1 to 32. Specifically, the sample materials were coated with the respective surface treatment agents and then directly dried in an oven at 180° C. without being washed with water, whereby test materials 1 to 33 were obtained. The mass of the film of each test material is shown in Table 4.

TABLE 4

| Example/Comparative Example | test material | sample material | pre-treatment agent | surface treatment agent | element contained in the film | mass of the film (g/m²) |
|---|---|---|---|---|---|---|
| Example 1 | 1 | e1 | d2 | 1 | Si, Zr | 3 |
| Example 2 | 2 | e1 | d2 | 2 | Si, Zr | 3 |
| Example 3 | 3 | e1 | d2 | 3 | Si, Zr | 3 |
| Example 4 | 4 | e1 | d2 | 4 | Si, Zr | 3 |
| Example 5 | 5 | e1 | d2 | 5 | Si, Zr | 3 |
| Example 6 | 6 | e1 | d2 | 6 | Si, Zr | 3 |
| Example 7 | 7 | e1 | d2 | 7 | Si, Zr | 3 |
| Example 8 | 8 | e1 | d2 | 8 | Si, Zr | 3 |
| Example 9 | 9 | e1 | d2 | 9 | Si, Zr | 3 |
| Example 10 | 10 | e1 | d2 | 10 | Si, Zr | 3 |
| Example 11 | 11 | e1 | d2 | 11 | Si, Zr | 3 |
| Example 12 | 12 | e1 | d2 | 12 | Si, Zr | 3 |
| Example 13 | 13 | e1 | d2 | 13 | Si, Zr | 3 |
| Example 14 | 14 | e1 | d2 | 14 | Si, Zr | 3 |
| Example 15 | 15 | e1 | d2 | 15 | Si, Zr | 3 |
| Example 16 | 16 | e1 | d2 | 16 | Si, Zr | 3 |
| Example 17 | 17 | e1 | d2 | 17 | Si, Zr | 3 |
| Example 18 | 18 | e1 | d2 | 18 | Si, Zr | 3 |
| Example 19 | 19 | e1 | d2 | 19 | Si, Zr | 3 |
| Example 20 | 20 | e1 | d1 | 20 | Si, Zr | 3 |
| Example 21 | 21 | e1 | d3 | 21 | Si, Zr | 3 |
| Example 22 | 22 | e2 | d2 | 4 | Si, Zr | 3 |
| Example 23 | 23 | e1 | d2 | 22 | Si, Zr | 0.1 |
| Example 24 | 24 | e1 | d2 | 23 | Si, Zr | 0.5 |
| Example 25 | 25 | e1 | d2 | 24 | Si, Zr | 1 |
| Example 26 | 26 | e1 | d2 | 25 | Si, Zr | 5 |
| Example 27 | 27 | e1 | d2 | 26 | Si, Zr | 10 |
| Example 28 | 28 | e1 | d2 | 27 | Si, Zr | 20 |
| Comparative Example 1 | 29 | e1 | d2 | 28 | Si | 3 |
| Comparative Example 2 | 30 | e1 | d2 | 29 | Si | 3 |
| Comparative Example 3 | 31 | e1 | d2 | 30 | Si | 3 |
| Comparative Example 4 | 32 | e1 | d2 | 31 | Zr | 3 |
| Comparative Example 5 | 33 | e1 | d2 | 32 | Si, Zr | 3 |

(5) Evaluation of Test Materials
(5-1) Adhesion Test

The film surfaces of the test materials 1 to 33 were each tape-peeled using a piece of commercially available CEL-LOTAPE (trademark), and the residual ratio of the film was evaluated.

◎: residual ratio=91 to 100%
○: residual ratio=71 to 90%
○-: residual ratio=51 to 70%
x: residual ratio=0 to 50%

(5-2) Tests after Heating

The test materials 1 to 33 were heated in the air atmosphere at a heating rate of 10° C./min and, after the temperature of the test materials reached 600° C., the test materials were exposed to a high-temperature environment with heating for 1,000 hours and subsequently cooled to room temperature.

(5-2-1) Adhesion Test

The test materials 1 to 33 exposed to the high-temperature environment were tested in the same manner as in the above-described (5-1) Adhesion Test.

(5-2-2) Crack Resistance Test

For each of the test materials 1 to 33 exposed to the high-temperature environment, the surface was observed under a scanning electron microscope (SEM, at magnification of ×500), and the presence or absence of crack generation was evaluated.

◎: No change was observed.
○: One to five cracks were observed.
○-: Cracks were observed over the entire surface.
x: Partial peeling was observed.

(5-2-3) Oxidation Resistance Test

For each of the test materials 1 to 33 exposed to the high-temperature environment, a cross-section was analyzed using an electron probe micro analyzer (EPMA) to evaluate the interdiffusion (diffusion of oxygen) between the test material and its film before and after the exposure to the high-temperature environment.

◎: No change was observed.
○: Thickening was observed at the interface of the film and the material.
○-: Diffusion was observed over the entire cross-section.
x: Partial peeling (not measurable) was observed.

The evaluation results of the test materials 1 to 33 are shown in Table 5.

It is noted here that, from the practical standpoint, the materials are required to have an evaluation of "○-" to "◎" in each of the above-described evaluation items.

TABLE 5

| test material | adhesion | adhesion after heating | crack resistance after heating | oxidation resistance after heating |
|---|---|---|---|---|
| 1 | ○- | ○- | ○- | ○- |
| 2 | ○- | ○- | ○- | ○ |
| 3 | ○- | ○- | ○ | ◎ |
| 4 | ◎ | ◎ | ◎ | ◎ |
| 5 | ○- | ○- | ○ | ◎ |
| 6 | ○- | ○- | ○- | ○ |
| 7 | ○- | ○- | ○- | ○- |
| 8 | ○- | ◎ | ◎ | ◎ |
| 9 | ○ | ◎ | ◎ | ◎ |
| 10 | ◎ | ◎ | ◎ | ◎ |
| 11 | ◎ | ◎ | ◎ | ◎ |
| 12 | ○ | ◎ | ◎ | ◎ |
| 13 | ○- | ◎ | ◎ | ◎ |
| 14 | ◎ | ○- | ◎ | ◎ |
| 15 | ◎ | ○ | ◎ | ◎ |
| 16 | ◎ | ◎ | ◎ | ◎ |
| 17 | ◎ | ◎ | ◎ | ◎ |
| 18 | ◎ | ○ | ◎ | ◎ |
| 19 | ◎ | ○- | ◎ | ◎ |
| 20 | ◎ | ○ | ◎ | ○ |
| 21 | ◎ | ○ | ◎ | ○ |
| 22 | ◎ | ◎ | ◎ | ◎ |
| 23 | ◎ | ◎ | ○- | ◎ |
| 24 | ◎ | ◎ | ○ | ◎ |
| 25 | ◎ | ◎ | ◎ | ◎ |
| 26 | ◎ | ◎ | ◎ | ◎ |
| 27 | ◎ | ◎ | ○ | ◎ |
| 28 | ◎ | ◎ | ○- | ◎ |
| 29 | ○- | x | x | x |
| 30 | ○- | x | x | x |
| 31 | ○- | x | x | x |
| 32 | x | x | ○- | ○- |
| 33 | ○- | x | x | x |

As shown in Table 5, it was found that the sample materials covered with a film containing Si and Zr metal elements according to the present embodiment exhibited excellent oxidation resistance, crack resistance and adhesion even when exposed to a high temperature.

The test materials of Examples were provided with no electrode part, however, it was confirmed that an electric current can be extracted from an end of each sample material, and that each sample material itself functions as a thermoelectric conversion element. In addition, thermoelectric conversion modules that were constructed by connecting plural thermoelectric conversion elements obtained by arranging electrodes on the respective sample materials were confirmed to be functional.

The invention claimed is:

1. A method for producing a thermoelectric conversion element, comprising a thermoelectric conversion component, comprising:
   a pretreatment step of contacting the thermoelectric conversion component with a pretreatment agent that comprises a phosphoric acid compound and water, and
   a film forming step of contacting the thermoelectric conversion component after the pretreatment step with a surface treatment agent that comprises Si and Zr ions to form a film comprising Si and Zr,
   wherein the thermoelectric conversion component comprises magnesium silicide and/or manganese silicide, and
   wherein a ratio (ZM/SM) of a Zr mass (ZM) to a Si mass (SM) in the film is in a range of 0.25 to 0.59.

2. The method for producing a thermoelectric conversion element according to claim 1, wherein the surface treatment agent is obtained by mixing an alkali metal silicate (A), a cerium oxide-stabilized zirconium oxide (B), and a component (C) that comprises at least one selected from metal oxide particles and clay minerals except for the alkali metal silicate (A) and cerium oxide-stabilized zirconium oxide (B).

3. The method for producing a thermoelectric conversion element according to claim 1, wherein the thermoelectric conversion component comprises polycrystalline magnesium silicide and/or polycrystalline manganese silicide.

4. A method for producing a thermoelectric conversion module, comprising
- a step of providing a plurality of the thermoelectric conversion element obtained by the method for producing a thermoelectric conversion element according to claim 1, and
- a step of connecting the plurality of the thermoelectric conversion elements.

* * * * *